(12) United States Patent
Shibuya

(10) Patent No.: US 6,356,911 B1
(45) Date of Patent: Mar. 12, 2002

(54) SHORTEST PATH SEARCH SYSTEM

(75) Inventor: Tetsuo Shibuya, Yamato (JP)

(73) Assignee: International Business Machines Corporation (*) Notice: Subject to any disclaimer, the term of this patent is extended or adjusted under 35 U.S.C. 154(b) by 0 days.

(21) Appl. No.: 09/210,325

(22) Filed: Dec. 11, 1998

(30) Foreign Application Priority Data

Dec. 11, 1997 (JP) .............................................. 9-341245

(51) Int. Cl.[7] .............................................. G06F 17/00
(52) U.S. Cl. .............................. 707/101; 707/4; 707/5; 707/6; 707/3
(58) Field of Search .................. 364/200; 370/256, 370/235, 206; 701/200, 209; 709/239; 707/3, 4, 5, 101, 6

(56) References Cited

U.S. PATENT DOCUMENTS

| | | | | |
|---|---|---|---|---|
| 4,987,536 A | * | 1/1991 | Humblet ...................... | 364/200 |
| 5,872,773 A | * | 2/1999 | Katzela et al. .............. | 370/256 |
| 5,978,732 A | * | 11/1999 | Kakitani et al. ............ | 701/200 |
| 6,016,306 A | * | 1/2000 | Le Boudec et al. ......... | 370/235 |
| 6,029,112 A | * | 2/2000 | Nam et al. ................... | 701/209 |
| 6,098,107 A | * | 8/2000 | Narvaez-Guarnieri et al. ... | 709/239 |
| 6,269,363 B1 | * | 7/2001 | Matias .......................... | 707/5 |

FOREIGN PATENT DOCUMENTS

JP  405240652 A  *  9/1993

OTHER PUBLICATIONS

Liu et al., "Integrating case–based reasoning, knowledge-based approach and Dijkstra algorithm for route finding", IEEE, 1994, pp. 149–155.*
Thorup, "Undirected single source shortest paths in linear time", IEEE, 1997, pp. 12–21, 1997.*
Han, "A new treatment of priority–first search maximum-likelihood soft–decision decoding for linear block codes", IEEE, 1997, pp. 394.*
Cormen et al., "Algorithms", McGraw–Hill Book Company, 1989, pp. 514–549.*
Thorup, "Undirected single source shortest paths in linear time",IEEE, Oct. 1997, pp. 12–21.*
Liu et al., "Finding the shortest route using cases, knowledge, and Djikstra's algorithm", IEEE, 1994, pp. 7–11.*

* cited by examiner

Primary Examiner—Wayne Amsbury
Assistant Examiner—Thuy Pardo
(74) Attorney, Agent, or Firm—Ronald L. Drumheller (57) ABSTRACT

An efficient method and system is provided for searching for the shortest paths between a source and multiple destinations, and between multiple sources and multiple destinations. The speed of the conventional Dijkstra method, which is the basic calculation method, is increased by employing information concerning the relationship between a node and a set of destinations on a graph. The relationship information is constituted by the estimate function $h(v)$ concerning a specific node v and a set T of destinations, where $h(v)$ is a lower bound of all the shortest path lengths extending from node v to each of the destination sets T. Employment of the estimate function can increase the speed of the Dijkstra method.

19 Claims, 9 Drawing Sheets

SHORTEST PATH SEARCH SYSTEM

BACKGROUND OF THE INVENTION

1. Field of the Invention

The present invention relates to a shortest path search system, and in particular to a method and a system for searching for the shortest path between multiple nodes.

2. Related Art

The problem of finding the shortest path between multiple nodes is a problem for which a set of a plurality of sources and a set of a plurality of destinations are provided, and the shortest source-destination path is found for each source paired with each of the destinations in the set of destinations. Therefore, when there are n source nodes and m destination nodes, the shortest path must be found for n×m pairs of sources and destinations. Nodes that are included in both the source set and the destination set may be present. The Dijkstra method is known as the only method available for calculating the shortest paths between a single source and multiple destinations on a directed graph having a non-negative edge length. For reference, the pseudo code of the Dijkstra method is described below.

1×NshortestPath (source s, destination set T)

```
{
    S and queue (PriorityQueue) are empty
    for (all nodes v) path p(v) = +∞;
    Enter source s in priority queue.
    path p(s) = 0;
    while (priority queue is not empty) {
        Delete, from priority queue, node v having
        smallest path p(v) value.
        Enter v in established set S.
        if (established set S includes destination set T)
        break.
        for (all edges e (destinations w) having v as
        a source) {
            if (p(w) > p(v) + edge length (e)) {
                p(w) = (p(v) + edge length (e);
                Enter w in priority queue.
            }
        }
    }
}
```

Conventionally, the number of times the Dijkstra method is repeated is equivalent to the count of the multiple sources for which the shortest paths to multiple destinations are calculated. This method is also employed for various types of navigation systems. A method for increasing the speed of the Dijkstra method is not yet to be proposed.

SUMMARY OF THE INVENTION

It is, therefore, one object of the present invention to provide an efficient method and system for searching for the shortest path between a source and multiple destinations.

It is another object of the present invention to provide a method and a system for searching for the shortest paths between multiple sources and multiple destinations.

It is an additional object of the present invention to resolve a path searching problem within a short period of time when searching for the shortest path between multiple nodes.

It is a further object of the present invention to provide a search method and a search system with which optimality is not lost during a search for the shortest path between multiple nodes.

To achieve the above objects, according to the present invention, the speed of the conventional Dijkstra method, which is the basic calculation method, is increased by employing information concerning the relationship between a node and a set of destinations on a graph. The relationship information is constituted by the estimate function h(v) concerning a specific node v and a destination sets T, where h(v) is a lower bound of all the shortest path lengths extending from node v to each of the destination sets T.

In the present invention, calculation of an estimate function h(v) that satisfies the above condition is performed to obtain a value called an estimate function since an evaluation to determine the shortest path is performed during the calculation. The employment of the estimate function can increase the speed of the Dijkstra method. The lower bound is a specific value equal to or less than the smallest value.

Figure 2:
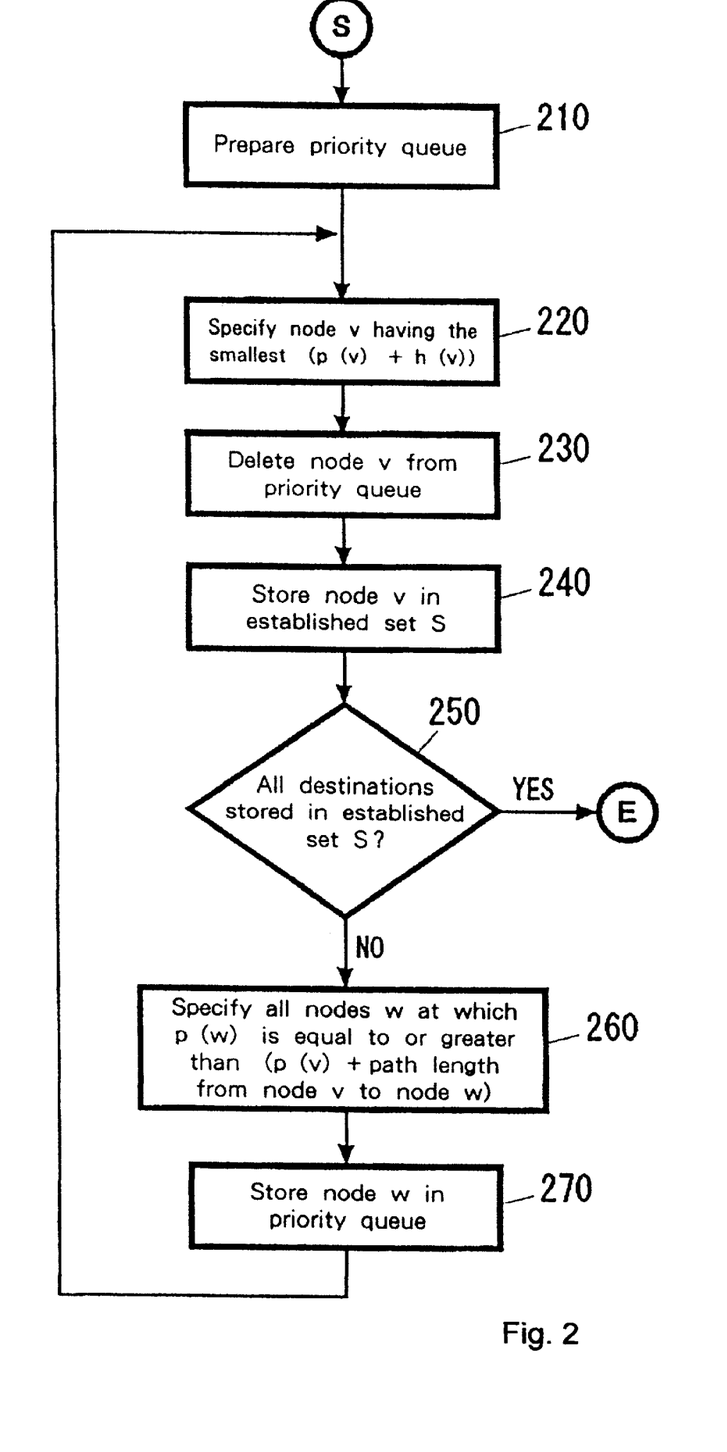
FIG. 2 is a block diagram illustrating the system for searching for the shortest path between a single source and multiple destinations.

FIG. 2 is a flowchart according to the present invention for searching for the shortest paths between a single source and multiple destinations. First, at block 210 a priority queue is prepared in which a node to be searched for is entered. At block 220 is specified a node v, entered in the priority queue, at which is minimized the sum of a path length p(v), between the source and the node v, and the lower bound h(v) of the shortest path of those for the nodes that adjoin the node v. When node v is specified in this manner, a specific direction characteristic can be provided for the extension of the search direction. At block 230, node v is deleted from the priority queue, and at block 240, node v is stored in the established set S, a set of solutions of the shortest paths. A check is then performed to determine whether all the destinations are included in the established set S (block 250). When all the destinations are stored, the shortest path search is terminated. At block 260, each node w is specified at which a path length p(w) is equal to or greater than the sum of a path length p(v) between the source and node v and a path length between node v and the specified node w. Finally, at block 270 all nodes w are entered in the priority queue, and program control returns to block 220.

DESCRIPTION OF THE PREFERRED EMBODIMENT

Figure 1:
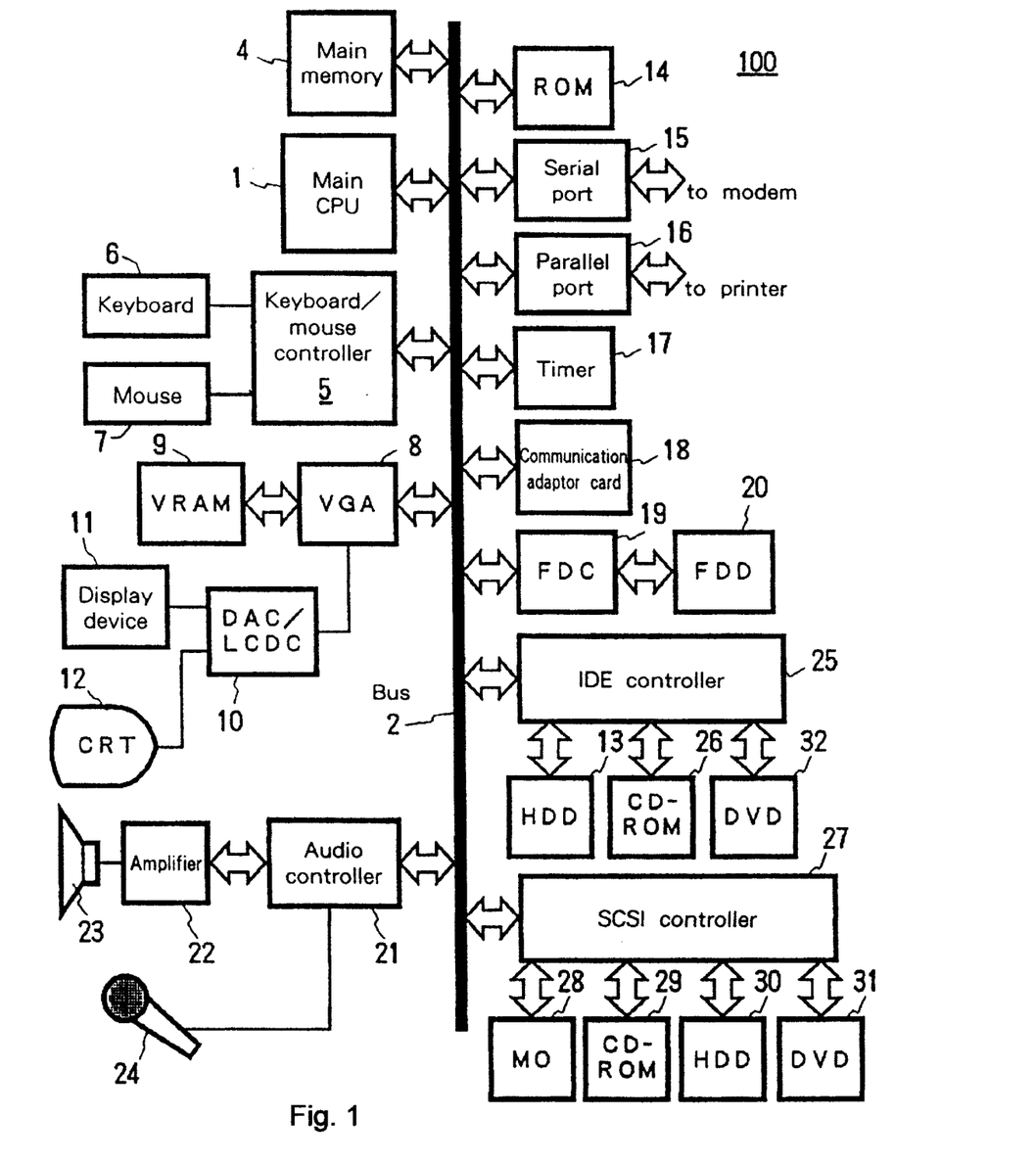
FIG. 1 is a diagram illustrating a hardware arrangement of a shortest path search system according to one embodiment of the present invention.

One embodiment of the present invention will now be described while referring to the accompanying drawings. FIG. 1 is a schematic diagram illustrating an example hardware arrangement of a shortest path searching system according to the present invention. A system 100 includes a central processing unit (CPU) 1 and a memory 4. The CPU 1 and the memory 4 are connected via a bus 2 and an IDE controller 25 to a hard disk drive 13 (or to a storage medium driver, such as a CD-ROM 26 or a DVD 32), which serves as an auxiliary storage device. Further, the CPU 1 and the memory 4 are connected via the bus 2 and a SCSI controller 27 to a hard disk drive 30 (or to a storage medium driver, such as an MO 28, a CD-ROM 29 or a DVD 31), which also serves as an auxiliary storage device. A floppy disk drive 20 is connected via a floppy disk controller 19 to the bus 2. For a navigation system, map information can be stored in the external storage device.

A floppy disk is inserted into the floppy disk drive 20. Computer program code or data for cooperating with an operating system to instruct the CPU to execute the present invention is stored on the floppy disk and the hard disk drive 13 (a storage medium, such as an MO, CD-ROM or a DVD), and in a ROM 14. For execution, the program code and the data are loaded into the memory 4. The computer program code may be compressed, or may be divided into a plurality of segments for storage in a plurality of storage media.

The system 100 also includes user interface hardware, has a pointing device (a mouse or a joystick) 7 or a keyboard 6 for data input, and employs a display 12 for visually providing data for a user. A printer can be connected to the system via a parallel port 16, and a modem can be connected via a serial port 15. For communication with another computer, the system 100 can be connected to a network, via the serial port 15, by the modem or a communication adaptor 18 (an Ethernet or a token ring card). A remote controlled transceiver for the exchange of data using infrared rays or wire can be connected to the serial port 15 or to the parallel port 16. The user interface hardware may be a touch panel wherein a display and a pointing device are integrated.

From an amplifier 22, a loudspeaker 23 receives an audio signal, which is provided by a D/A (digital/analog) conversion performed by an audio controller 21, and outputs it as sound. The audio controller 21 converts analog audio data, received from a microphone 24, into digital data, and also fetches external audio data into the system.

From the above description, it should be easily understood that the shortest path search system and the navigation system of the present invention can be implemented by employing a common personal computer (PC); a workstation; a notebook PC; a palmtop PC; a network computer; various electronic home appliances, such as a television incorporating a computer; a game machine having a communication function; a communication terminal having a communication function, such as a telephone, a facsimile machine, a portable telephone, a PHS or a personal digital assistant; or a combination of these devices. The above described components are merely examples, and not all of them are required for the present invention.

Figures 3, 3A:
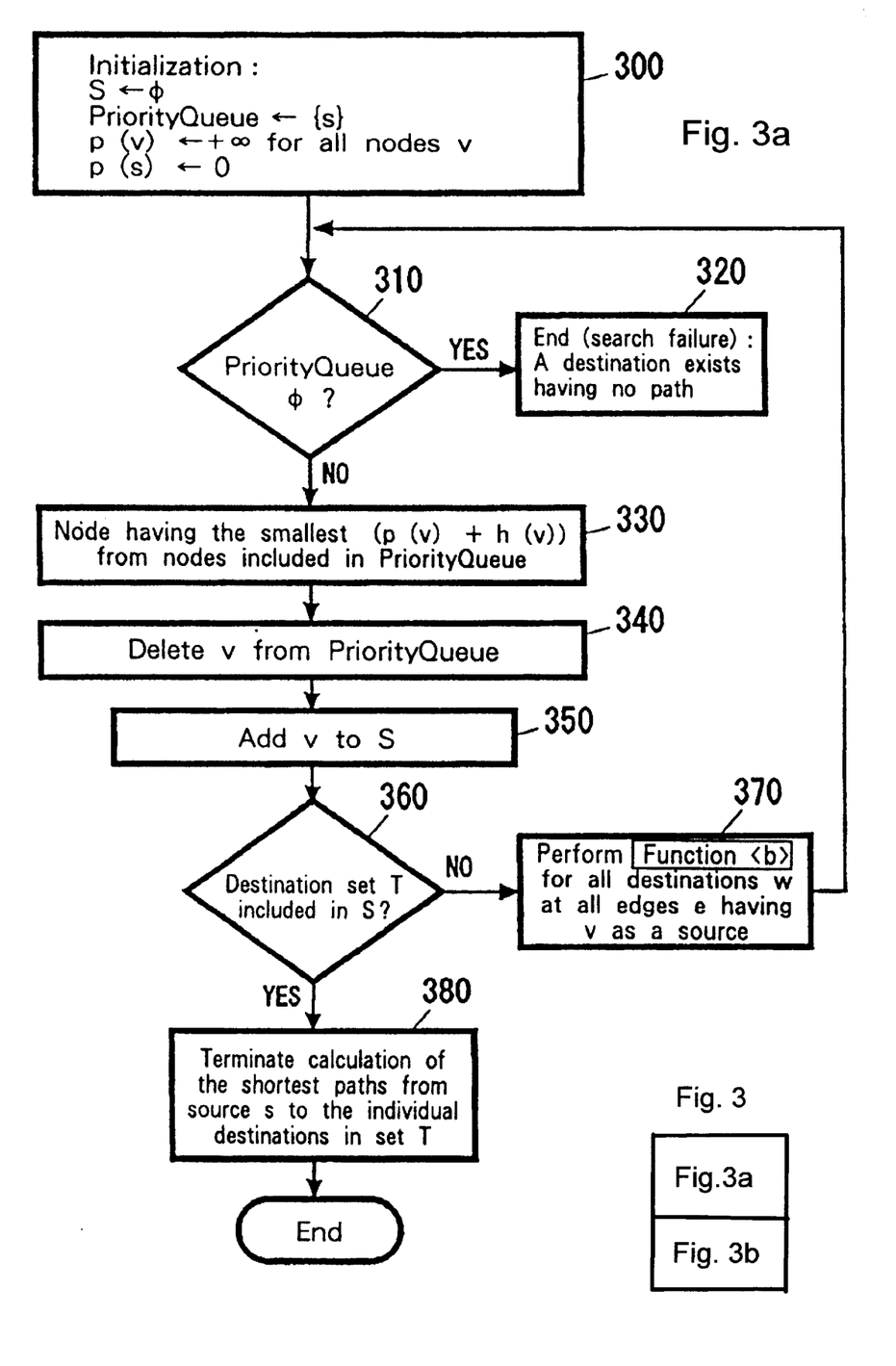
FIG. 3 is a flowchart showing the processing for searching for the shortest path between a single source and multiple destinations.
Figure 3B:
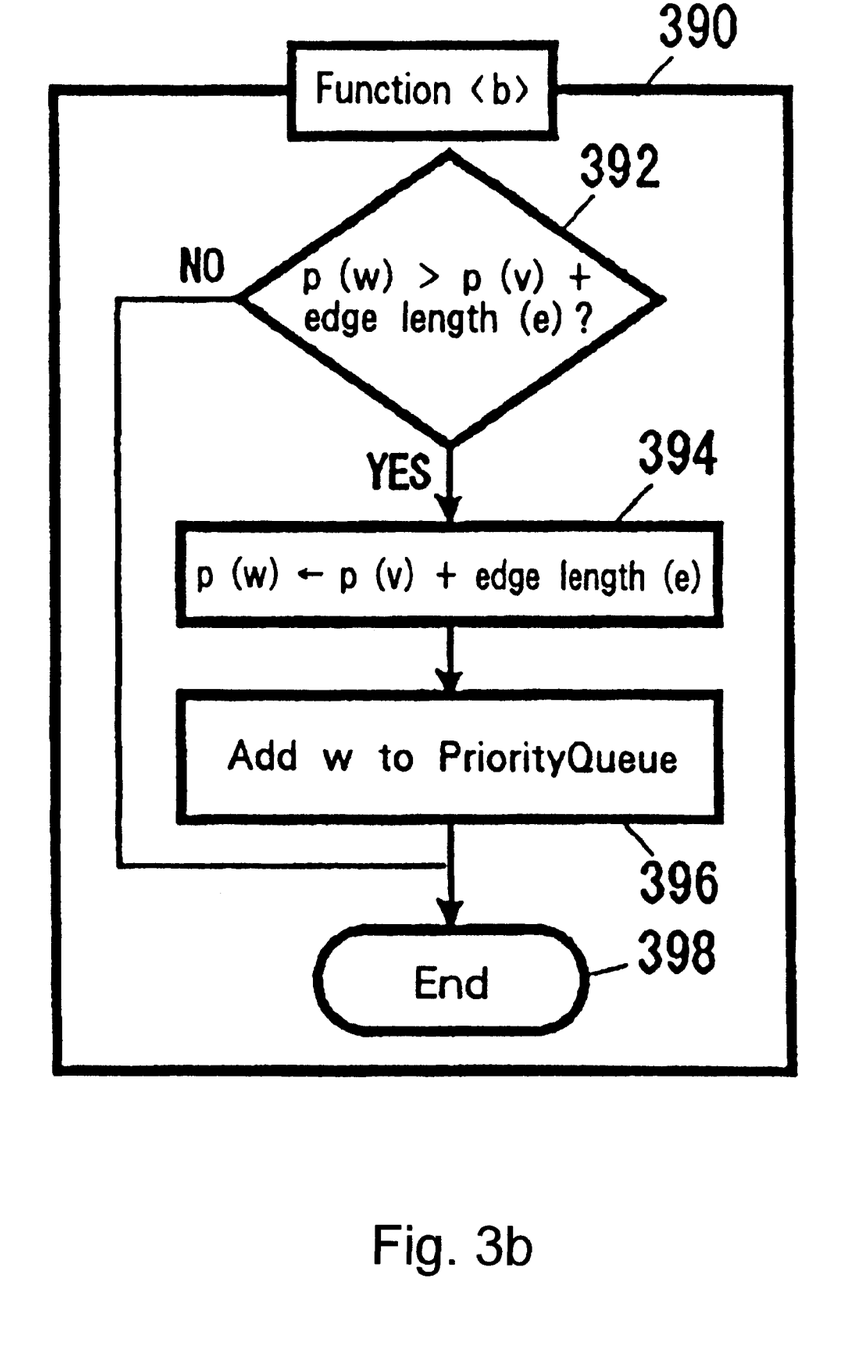

FIG. 3 is a detailed flowchart for a method according to the present invention for searching for the shortest paths between a single source and multiple destinations. At step 300, a shortest path established set S is initialized, and the first node s is entered in a priority queue (PriorityQueue). The maximum value is entered in advance as path lengths $p(v)$ for all nodes v, which are the sources of the paths. The first path length $p(s)$ is 0. At step 310, a check is performed to determine whether the priority queue is empty. If the priority queue is empty, processing is terminated at step 320. This means the search failed, i.e., there are no paths leading to several, or all of the destinations. When the decision at step 310 is No, at step 330 a node v is searched for in the priority queue that has the smallest $p(v)+h(v)$ value.

The calculation method that uses $p(v)+h(v)$ differs from that performed based on the conventional Dijkstra method.

In other words, $p(v)+h(v)$ corresponds to a portion where the speed of the Dijkstra method is increased using the relationship information applicable to the nodes on the graph and the destination set. This relationship information is a value $h(v)$ concerning a specific node v and a destination set T, i.e., an estimate function $h(v)$, defined as a lower bound of all the shortest path lengths leading from node v to each of the destinations in the set T. The employment of the estimate function can increase the speed of the Dijkstra method. The lower bound is a specific value equal to or smaller than the smallest value (a value smaller than the shortest length). A value that is always greater by a constant value than the estimated function may be defined as $h(v)$.

Program control then moves to step 340, whereat node v at which $p(v)+h(v)$ is minimized is deleted from the priority queue. This means that one established set of the shortest paths is found. At step 350, node v is added to the established set S, and at step 360 a check is performed to determine whether the destination set T is included in the set S. When the decision at step 360 is No, at step 370 the function <b> is performed for all the destinations w of all edges e that have node v as their source.

As for the function <b>, as is shown in block 390, first, at step 392 a check is performed to determine whether the sum of the path length $p(v)$ to node v and the edge length (e) is smaller than a path length $p(w)$ to node w. When the decision is No, processing is terminated at step 398. If the decision at step 392 is Yes, the path length $p(v)$+the edge length (e) is substituted into $p(w)$, and w is added to the priority queue. In short, the candidates for the shortest path from the source to node w are updated, as needed. When at step 370 a new priority queue is added, program control returns to step 310.

The above processing is described using pseudo-code as follows.

```
1 × NshortestPaths2 (source s, destination set T)
{
    S and Priority Queue are empty.
    for (all nodes v) path p(v) = +∞;
    Enter source s in priority queue.
    path p(s) = 0;
    while (priority queue is not empty) {
        Delete, from priority queue, node v having
        smallest path p(v) value.
        Enter v in established set S.
        if (established set S includes destination set T)
        break.
        for (all edges e (destinations w) having v as
        a source) {
            if (p(w) > p(v) + edge length (e)) {
                p(w) = (p(v) + edge length (e);
                Enter w in priority queue.
            }
        }
    }
}
```

With this calculation, the number of search areas can be reduced, and the number of calculations can also be reduced. In addition, by using this calculation optimality will not be lost. When there are a plurality of sources, these procedures need only be repeated the number of times equivalent to the number of sources, as in the Dijkstra method.

When the following limitation is provided for all the edges e=(v, w), the estimate function $h(v)$ is represented by:

$$h(v) < h(w) + \text{edge length } (v, w).$$

As a result, entering the same node in the established set S twice or more is prevented, the number of calculations is further reduced, and the efficiency of the method is increased.

As the most basic value for the estimate function h(v), which can be employed for the directed graph having a non-negative edge length, there is an estimate function h*(v), where h*(v) is the shortest length of all the shortest paths from the node v to all the destinations in the set T. The estimate function h*(v) can be acquired by searching in the opposite direction from the destination set T. For the reference, the most basic pseudo-code is represented below, which is acquired for a node set U for which the estimate function h*(v) is to be obtained.

ComputeH* (target set U, destination set T)

```
{
    S and Priority Queue are empty.
    for (all nodes v) h*(v) = +∞;
    for (all nodes t in T) {
        Enter node t in priority queue.
        h*(t) = 0;
    }
    while (priority queue is not empty) {
        Delete, from priority queue, node v having
        smallest h*(v) value.
        Enter v in established set S.
        if (established set S includes destination set U)
        break.
        for (all edges e (sources w) having v as a
        source) }
            if (h*(w) > h*(v) + edge length (e)) {
                h*(w) = h*(v) + edge length (e);
                Enter w in priority queue.
            }
        }
    }
}
```

The value of h(v) is not limited to h*(v), but may be any value that satisfies the first h(v) condition. That is, regardless of the calculation method used for h(v), any method can be used so long as the method employs relationship information for individual nodes on the graph and in the destination set. Further, a method whereby the directions of the directed edges on the graph are inverted and the search is performed in the opposite direction (from the destinations) is also equivalent to the above described method, and a calculation method that employs the reversed source node and destination node can also be performed. Only the path lengths may be listed by using the same method.

Figure 4:
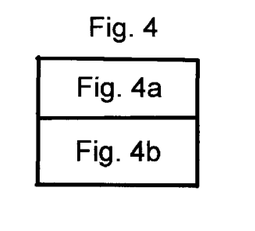
FIG. 4 is a flowchart showing the processing for searching for the shortest path between a source set S and a destination set T.
Figure 4A:
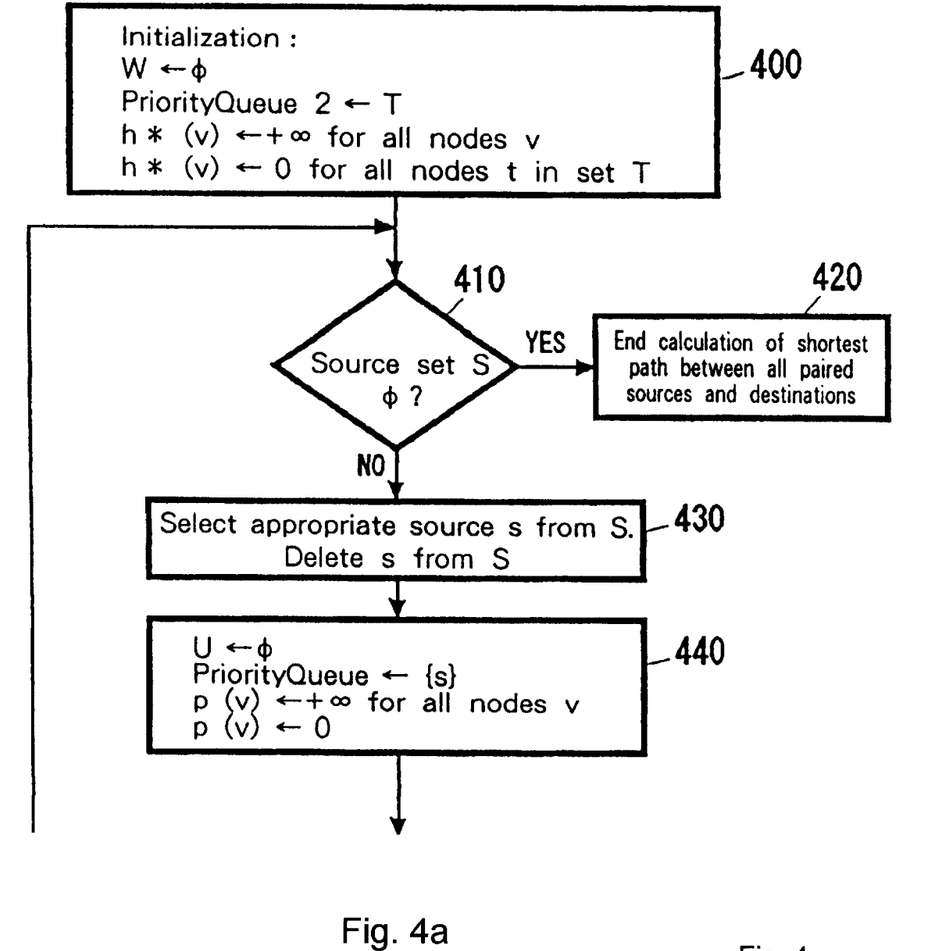
Figure 4B:
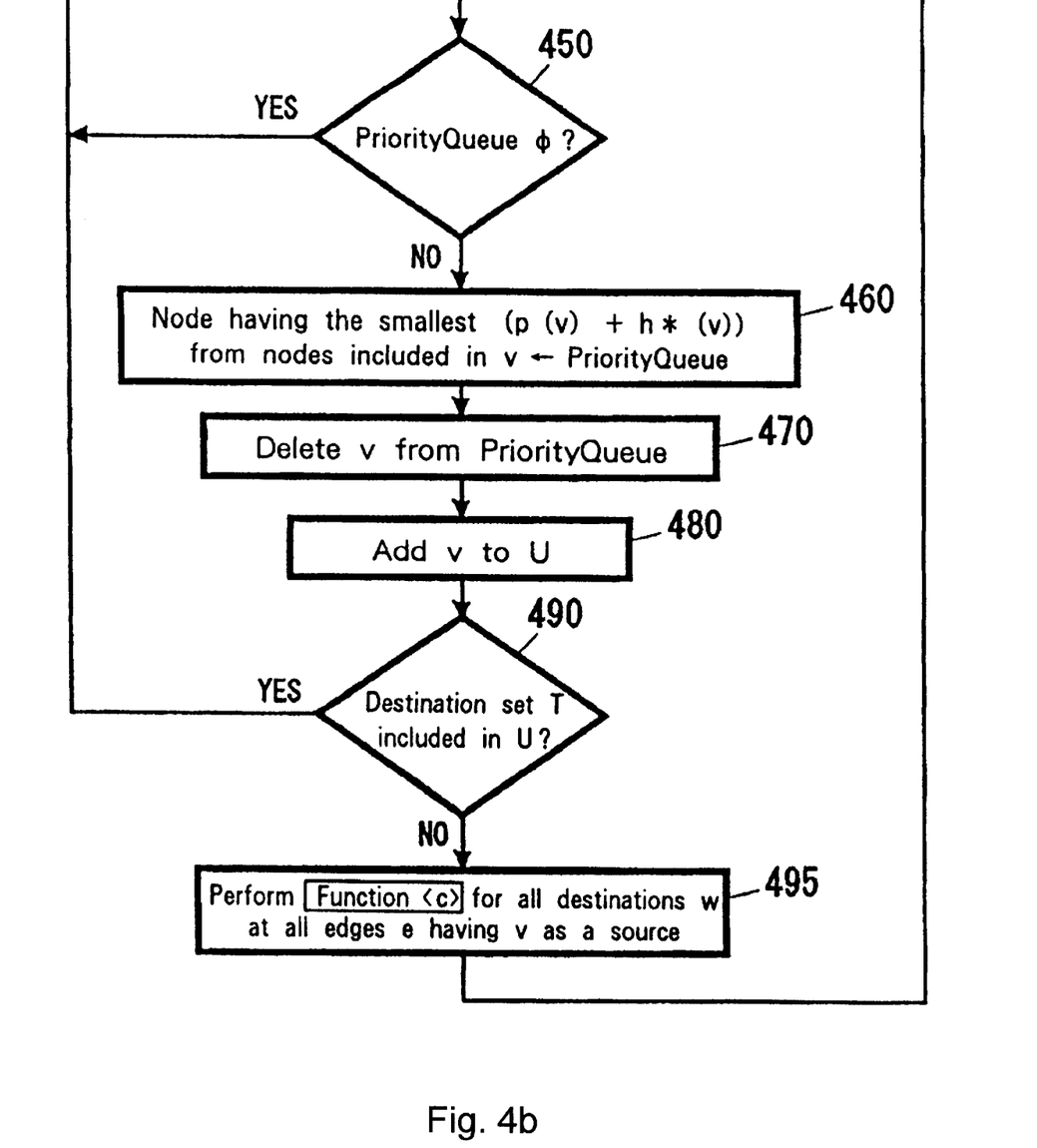

When the search range is large, in many cases it is useless to acquire the estimate function for all the nodes on the graph. Thus, it is possible to obtain an estimate function, only when necessary. FIG. 4 is a flowchart employing h*(v) as the estimate function.

First, at step 400 a shortest path established set W is initialized, and a set T of destinations is stored in a priority queue 2 (PriorityQueue2). Also, the maximum value is entered in h*(v) in advance for nodes v that are the sources of the paths. It should be noted that 0 is stored in h*(v) for all destinations t in the set T. At step 410, a check is performed to determine whether a set S of sources is empty. If the source set S is empty, the processing is terminated at step 420. This means that the calculation to determine the shortest path between the source and the destination is completed for all the source and destination pairs. If the decision at step 410 is No, at step 430, an appropriate source s is selected and delated from set S. Next, at step 440 an established set U is emptied, node s is substituted into the priority queue, and the maximum value is stored in the path lengths p(v) for all the nodes v. The first path node p(s) is 0. Then, program control moves to step 450, whereat a check is performed to determine whether the priority queue is empty. If the decision is Yes, program control returns to step 410. If the decision at step 450 is No, program control advances to step 460. At step 460, a node v having the smallest p(v)+h*(v) value is found in the priority queue. This means one shortest path established set is found.

At step 470, the node v having the smallest p(v)+h*(v) value is deleted from the priority queue. At step 480 node v is added to the established set U. At step 490, a check is performed to determine whether the established set U is included in the destination set T. While the decision is made for the set U at step 490, the determination as to whether node v is included in the destination set T may be performed at time the node v is found. If the set U is included, program control returns to step 410. If the decision at step 490 is No, at step 495 the function <c> is performed for the individual destinations w of all the edges e that employ node v as the source.

As for the function <c>, as is shown at block 500 in FIG. 5(*a*), first, at step 510 a check is performed to determine whether the path length p(w) to node w is equal to or greater than the sum of the path length p(v) and the edge length (e) to node v. If the decision is No, at step 570 the node w is entered in the priority queue, and at step 580 the function <c> is terminated. When the decision at step 510 is Yes, at step 520, p(v)+edge length (e) is substituted into the p(w).

Figure 5A:
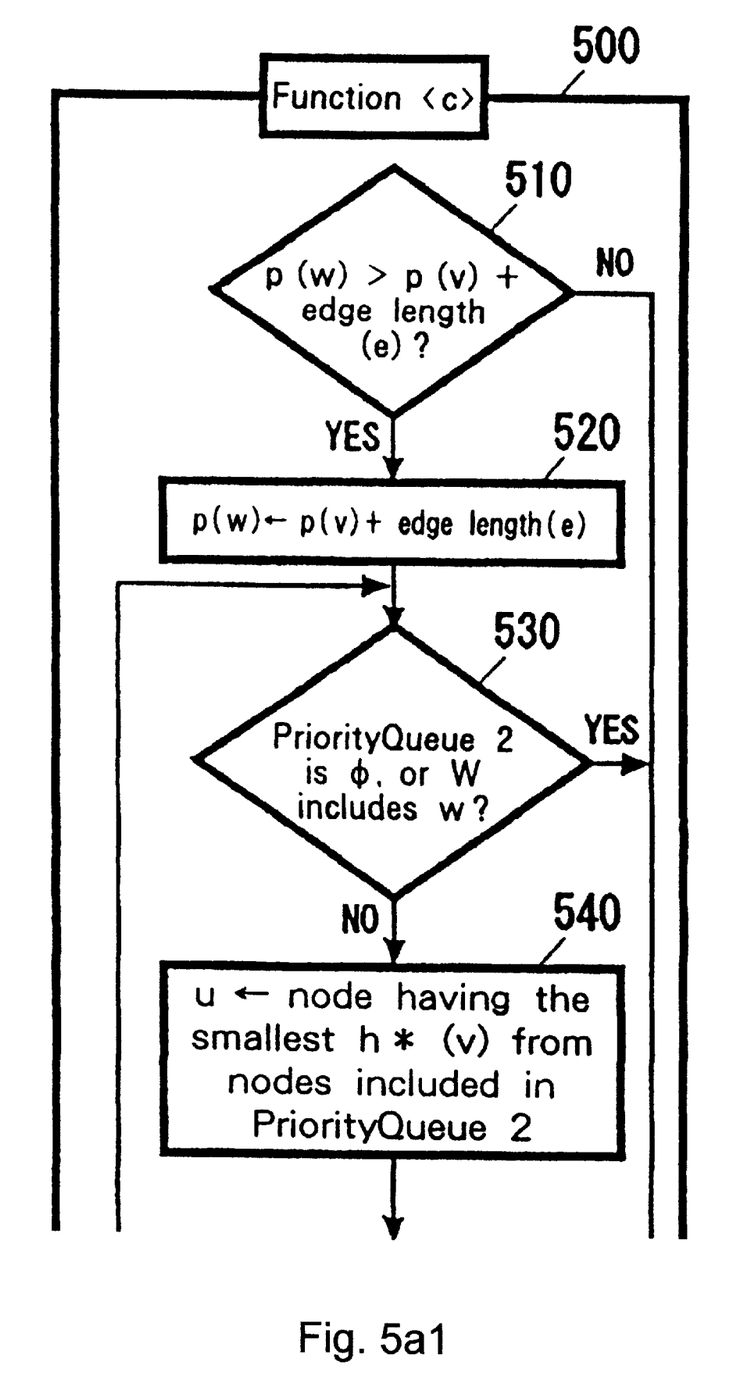
FIG. 5 is a flowchart showing the processing for searching for the shortest path between a source set S and a destination set T.
Figure 5A:
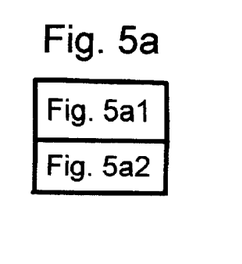
Figure 5A:
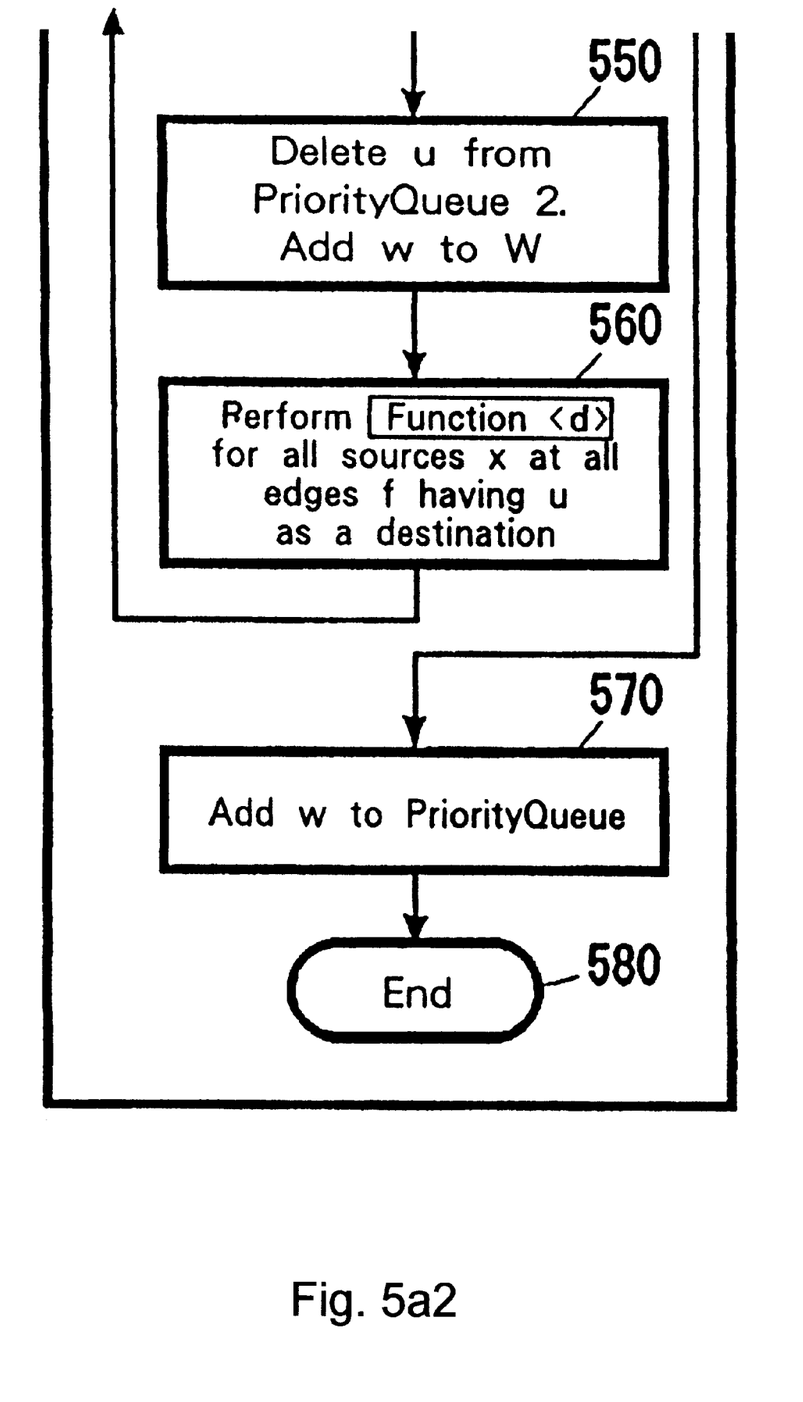
Figure 5B:
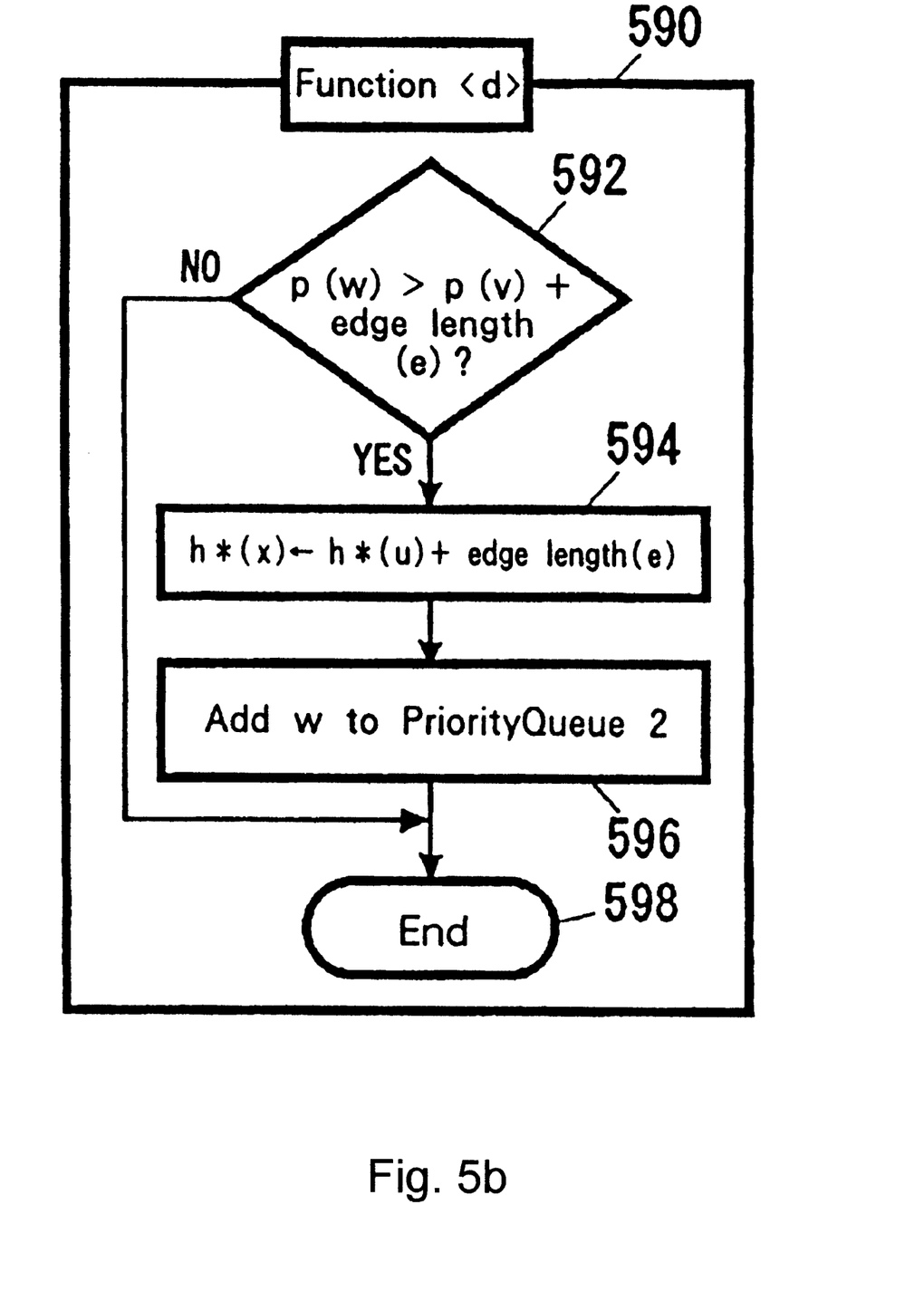

Program control then moves to step 530, whereat a check is performed to determine whether the priority queue 2 is empty or whether the established set W includes node w. When node W is included, program control advances to step 570, and if it is not included, program control goes to step 540. At step 540 a node in the priority queue 2 that has the smallest h*(v) value is substituted into node u. At step 550, node u is deleted from the priority queue 2, and node w is added to the established set W. At step 560, the function <d> is performed for the individual sources x of all the edges f that includes node u as the destination.

As for the function <d>, as is shown in block 590 in FIG. 5(*b*), first, at step 592 a check is performed to determine whether the path length p(w) to node w is equal to or greater than the sum of the path length p(v) and the edge length (e) to node v. If the decision is No, the processing is terminated at step 598. When the decision at step 592 is Yes, at step 594, h*(u)+edge length (e) is substituted into h*(x). At step 596, the node w is added to the priority queue 2. Program control thereafter goes to step 598, whereat the processing is terminated.

A description will be given below for the pseudo-code for the flowcharts in FIGS. 4 and 5 that provides as few unnecessary estimate functions as possible.

ComputeH*2 (target node w)

```
{
    while (priority queue 2 is not empty and established
    set W does not include node w) {
        Delete, from priority queue 2, node v having
        smallest h*(v) value.
        Enter v in established set W of h*(v).
        for (all edges e (sources x) having v as a
        destination) {
            if (h*(x) > h*(v) + edge length (e)) {
                h*(x) = h*(v) + edge length (e);
                Enter x in priority queue 2.
            }
        }
    }
}
1 × NShortestPaths3 (source s, destination set T)
```

-continued

```
{
    U and priority queue are empty.
    for (all nodes v) path p(v) = +∞;
    Enter source s in priority queue.
    path p(s) = 0;
    while (priority queue is not empty) {
        Delete, from priority queue, node v having
        smallest p(v) + h*(v) value.
        Enter v in established set U.
        if (established set U includes destination set T)
        break.
        for (all edges e (destinations w) having v as
        a source) {
            if (p(w) > p(v) + edge length (e)) {
                p(w) = (p(v) + edge length (e);
                ComputeH*2(w);
                Enter w in priority queue.
            }
        }
    }
}
N x MShortestPaths (source s, destination set T)
{
    W and priority queue 2 are empty
    for (all nodes v) estimate function h*(v) = +∞;
    for (all nodes t in T) {
    Enter node t in priority queue 2
    h*(t) = 0;
    }
    for (all nodes s included in set S) 1 x NshortestPaths3
    (source s, destination set T);
}
```

An example search method used for a map on which there are dead ends will be described. When a node exists along a road from which there is no path to the destination, the system for calculating as few unnecessary estimate functions as possible may perform calculations for an entire graph. For example, this corresponds to a situation where a dead end is encountered. In such a case where a search of the entire graph would require too much time, the estimate function can be performed after being changed as follows: h' (v)=the smaller value of either h*(v) and a proper constant c. The estimate function h' (v) can be obtained, in the same manner as for h*(v), by a search in the reverse direction beginning at the destination set T. For reference, the most basic pseudo-code for obtaining the h' (v) is described below.
ComputeH' (destination set T, constant c)

```
{
    S and priority queue are empty.
    for (all nodes v) h*(v) = c;
    for (all nodes t in T) {
        Enter node t in priority queue
        h*(t) = 0;
    {
    while (priority queue is not empty) {
        Delete, from priority queue, node v having
        smallest h*(v) value.
        Enter v in established set S of h* (v).
        for (all edges e (sources w) having v as a
        destination) {
            if (h*(w) > h*(v) + edge length (e)) {
                h*(w) = h*(v) + edge length (e);
                Enter w in priority queue.
            }
        }
    }
}
```

That is, instead of the maximum value, the constant c is stored in h' (v) for all the nodes v, which are destinations to which the paths lead. As a result, a search of the entire graph can be avoided when calculating an estimate function. However, it is difficult to set an appropriate constant c. Therefore, actually the estimate functions for the nodes included in the source set should be calculated, and then the constant c should be set to an appropriate value that exceeds the largest estimate function of all.

The above described estimate function is acquired by using the method that employs the actual path length. Since with this method a search in the reverse direction is necessary, this method is not applied for a system having a small memory capacity that does not store relationship information for edges in the reverse direction. In this case, the linear distance can be employed. The estimate function d(v), which is the smallest linear distance of those from node v to the individual destinations, satisfies the limitation imposed on the estimate function. A data structure, such as a k-d tree structure, is well known as a means for calculating this estimate function, and high-speed calculation is possible. Further, each estimate function can be calculated as needed, and useless calculations can be minimized.

According to the present invention, a high-speed path searching system is provided that can be installed in a navigation system, a variety of optimization tools and a calculating system for traveling salesmen, for vehicle deliveries or for stationing in a warehouse. In addition, a method is provided for searching for the shortest paths between multiple sources and multiple destinations, and for maintaining the optimality. By using the efficient algorithm of the present invention, the time required for the shortest path calculation process can be reduced by 30 to 70%, compared with time required when using the conventional method.

What is claimed is:

1. A shortest path search system for searching for a shortest path between one source and multiple destinations comprising:

(1) a priority queue producer for producing a priority queue to store nodes to be searched for;

(2) a node finder for locating a node v, stored in said priority queue, with which to minimize the sum of a length p(v) of a path extending between a source and said node v and a value of an estimate function h(v), obtained from a relationship between a node adjacent to said node v and a set of destinations, where h(v) is a lower bound of all the shortest path lengths extending from node v to each of the multiple destinations;

(3) a node deleter for deleting said node v from said priority queue;

(4) a storage means for storing said node v in an established set S of shortest paths;

(5) a process terminator for terminating a search process when said multiple destinations are included in said established set S;

(6) a node finder for locating all nodes w that adjoin said node v and at which a path length p(w) is equal to or greater than the sum of a path length p(v) from said source to said node v and a path length from said node v to said node w; and (7) a storage means for storing all said nodes w in said priority queue.

2. A shortest path search system for searching for shortest paths from multiple sources to multiple destinations, comprising, for each of said sources:

(1) a priority queue producer for producing a priority queue to store nodes to be searched for;

(2) a node finder for locating a node v, stored in said priority queue, with which to minimize the sum of a length p(v) of a path extending between a source and said node v and a value of an estimate function h(v), obtained from a relationship between a node adjacent to said node v and a set of destinations, where h(v) is a lower bound of all the shortest path lengths extending from node v to each of the multiple destinations;

(3) a node deleter for deleting said node v from said priority queue;

(4) a storage means for storing said node v in an established set S ofe shortest paths;

(5) a process terminator for terminating a search process when said multiple destinations are included in said established set S;

(6) a node finder for locating all nodes w that adjoin said node v and at which a path length p(w) is equal to or greater than the sum of a path length p(v) from said source to said node v and a path length from said node v to said node w; and (7) a storage means for storing all said nodes w in said priority queue.

3. A navigation system for searching for a shortest path between one source and multiple destinations comprising:

(1) a priority queue producer for producing a priority queue to store nodes to be searched for;

(2) a node finder for locating a node v, stored in said priority queue, with which to minimize the sum of a length p(v) of a path extending between a source and said node v and a value of an estimate function h(v), obtained from a relationship between a node adjacent to said node v and a set of destinations, where h(v) is a lower bound of all the shortest path lengths extending from node v to each of the multiple destinations;

(3) a node deleter for deleting said node v from said priority queue;

(4) a storage means for storing said node v in an established set S of shortest paths;

(5) a process terminator for terminating a search process when said multiple destinations are included in said established set S;

(6) a node finder for locating all nodes w that adjoin said node v and at which a path length p(w) is equal to or greater than the sum of a path length p(v) from said source to said node v and a path length from said node v to said node w; and (7) a storage means for storing all said nodes w in said priority queue.

4. A navigation system for searching for shortest paths from multiple sources to multiple destinations, comprising, for each of said sources:

(1) a priority queue producer for producing a priority queue to store nodes to be searched for;

(2) a node finder for locating a node V, stored in said priority queue, with which to minimize the sum of a length p(v) of a path extending between a source and said node v and a value of an estimate function h(v), obtained from a relationship between a node adjacent to said node v and a set of destinations, where h(v) is a lower bound of all the shortest path lengths extending from node v to each of the multiple destinations;

(3) a node deleter for deleting said node v from said priority queue;

(4) a storage means for storing said node v in an established set S of shortest paths;

(5) a process terminator for terminating a search process when said multiple destinations are included in said established set S;

(6) a node finder for locating all nodes w that adjoin said node v and at which a path length p(w) is equal to or greater than the sum of a path length p(v) from said source to said node v and a path length from said node v to said node w; and (7) a storage means for storing all said nodes w in said priority queue.

5. The system according to claim 1, wherein said estimate function h(v) always satisfies the condition that a value of h(v) is always smaller than the sum of a value of h(w) and said path length from said node v to said node w.

6. The system according to claim 1, wherein said value of said estimate function h(v) is smaller than the length of the shortest path among paths extending to all the nodes adjoining said node V.

7. The system according to claim 6, wherein an estimate function that always has a value greater by the equivalent of a constant than said estimate function h(v) is defined as an estimate function h(v).

8. The system according to claim 1, wherein said value of said estimate function h(v) is equal to the length of the shortest path among paths extending to all nodes adjoining said node v.

9. The system according to claim 1, wherein said value of said estimate function h(v) is a smaller value, and is either an appropriate constant c or a value equal to the length of the shortest path among paths extending to all nodes adjoining said node v.

10. The system according to claim 1, wherein said value of said estimate function h(v) is the shortest linear distance from all nodes adjoining said node v to each of said multiple destination sets.

11. A shortest path search method for searching for a shortest path between one source and multiple destinations, comprising the steps of:

(1) producing a priority queue to store nodes to be searched for;

(2) locating a node v, stored in said priority queue, with which to minimize the sum of a length p(v) of a path extending between a source and said node v and a value of an estimate function h(v), obtained from a relationship between a node adjacent to said node v and a set of destinations, where h(v) is a lower bound of all the shortest path lengths extending from node v to each of the multiple destinations;

(3) deleting said node v from said priority queue;

(4) storing said node v in an established set S of shortest paths;

(5) locating all nodes w that adjoin said node v and at which a path length p(w) is equal to or greater than the sum of a path length p(v) from said source to said node v and a path length from said node v to said node w;

(6) storing all said nodes w in said priority queue; and (7) repeating said steps (2) to (6) until all of said destinations are stored in said established set S.

12. A storage medium for including a program for searching for a shortest path between one source and multiple destinations, said program comprising:

(1) a priority queue production function for producing a priority queue to store nodes to be searched for;

(2) a node finding fimction for locating a node v, stored in said priority queue, with which to minimize the sum of a length p(v) of a path extending between a source and said node v and a value of an estimate function h(v), obtained from a relationship between a node adjacent to said node v and a set of destinations, where h(v) is a lower bound of all the shortest path lengths extending from node v to each of the multiple destinations;

(3) a node deletion function for deleting said node v from said priority queue;

(4) a storage function for storing said node v in an established set S of shortest paths;

(5) a node finding function for locating all nodes w that adjoin said node v and at which a path length p(w) is equal to or greater than the sum of a path length p(v) from said source to said node v and a path length from said node v to said node w;

(6) a storage function for storing all said nodes w in said priority queue; and (7) a repeating function for repeating said functions (2) to (6) until all of said destinations are stored in said established set S.

13. A storage medium for storing a program for searching for shortest paths from multiple sources to multiple destinations, said program comprising:

(1) a priority queue production function for producing a priority queue to store nodes to be searched for;

(2) a node finding function for locating a node v, stored in said priority queue, with which to minimize the sum of a length p(v) of a path extending between a source and said node v and a value of an estimate function h(v), obtained from a relationship between a node adjacent to said node v and a set of destinations, where h(v) is a lower bound of all the shortest path lengths extending from node v to each of the multiple destinations;

(3) a node deletion fimction for deleting said node v from said priority queue;

(4) a storage function for storing said node v in an established set S of shortest paths;

(5) a node finding function for locating all nodes w that adjoin said node v and at which a path length p(w) is equal to or greater than the sum of a path length p(v) from said source to said node v and a path length from said node v to said node w;

(6) a storage function for storing all said nodes w in said priority queue; and (7) a repeating function for repeating said functions (2) to (6) until all of said destinations are stored in said established set S, wherein said storage medium including a program for applying said functions (1) to (7) to each of said multiple sources.

14. The storage medium according to claim 12, wherein said estimate function h(v) always satisfies a condition where a value of h(v) is always smaller than the sum of a value of h(w) and said path length from said node v to said node w.

15. The storage medium according to claim 12, wherein said value of said estimate function h(v) is smaller than the length of the shortest path among paths extending to all the nodes adjoining said node v.

16. The storage medium according to claim 15, wherein an estimate function that always has a value greater by the equivalent of a constant than said estimate function h(v) is defined as an estimate function h(v).

17. The storage medium according to claim 12, wherein said value of said estimate function h(v) is equal to the length of the shortest path among paths extending to all nodes adjoining said node v.

18. The storage medium according to claim 12, wherein said value of said estimate function h(v) is a smaller value, and is either an appropriate constant c or a value equal to the length of the shortest path among paths extending to all nodes adjoining said node v.

19. The storage medium according to claim 12, wherein said value of said estimate function h(v) is the shortest linear distance from all nodes adjoining said node v to each of said multiple destination sets.

* * * * *